United States Patent
Watanabe et al.

(10) Patent No.: US 6,184,049 B1
(45) Date of Patent: Feb. 6, 2001

(54) METHOD FOR FABRICATING COMPOUND SEMICONDUCTOR EPITAXIAL WAFER AND VAPOR PHASE GROWTH APPARATUS USING THE SAME

(75) Inventors: Masataka Watanabe, Gunma-ken; Tsuneyuki Kaise; Masayuki Shinohara, both of Annaka, all of (JP)

(73) Assignee: Shin-Etsu Handotai, Co., Ltd., Tokyo (JP)

( * ) Notice: Under 35 U.S.C. 154(b), the term of this patent shall be extended for 0 days.

(21) Appl. No.: 09/129,381

(22) Filed: Aug. 5, 1998

(30) Foreign Application Priority Data

Aug. 7, 1997 (JP) .................................................. 9-225700

(51) Int. Cl.⁷ .................................................. H01L 21/00
(52) U.S. Cl. .................................................. 438/22; 438/46
(58) Field of Search .................................. 438/41, 46, 47, 438/478, 507; 257/94, 101

(56) References Cited

U.S. PATENT DOCUMENTS 5,912,476 * 5/1999 Wantanabe et al. .................. 257/94

* cited by examiner

Primary Examiner—David Nelms
Assistant Examiner—Quoc Hoang
(74) Attorney, Agent, or Firm—Snider & Associates; Ronald R. Snider

(57) ABSTRACT

A method for fabricating a compound semiconductor epitaxial wafer having a uniform epitaxial layer-thickness distribution independently of positions of compound semiconductor wafers placed within a reaction furnace (19), and a vapor phase growth apparatus for implementing the method.

A group III source gas (13) is flowed from a gas inlet (14) of the reaction furnace (19) to a gas outlet (16) thereof, whereas a group V source gas (15) is supplied as dispersedly from a plurality of groups of gas discharge ports (18a, 18b, 18c) provided in a flow direction of the group III source gas (13).

5 Claims, 3 Drawing Sheets ered within the reac- compound semiconductor wafers arranged within the reac-

METHOD FOR FABRICATING COMPOUND SEMICONDUCTOR EPITAXIAL WAFER AND VAPOR PHASE GROWTH APPARATUS USING THE SAME

This disclosure relates to subject matter contained in Japanese patent application No. 225700/1997 (filed on Aug. 7, 1997) which is expressly incorporated herein by reference in its entirety.

BACKGROUND OF THE INVENTION

1. Field of the Invention

This invention relates to a method for fabricating a compound semiconductor epitaxial wafer and a vapor phase growth apparatus using the method. More particularly, the present invention concerns a method for fabricating a compound semiconductor epitaxial wafer which is composed of elements belonging to a periodic table groups III and V and suitably used for fabrication of a light emitting diode, and a vapor phase growth apparatus using the method.

2. Description of the Related Art

In order to manufacture a red-, orange- or yellow-color light emitting diode, there is used a compound semiconductor epitaxial wafer in which an epitaxial layer of gallium arsenide phosphide $GaAs_{1-a}P_a$ (where a is a real number satisfying a relationship of $0 \leq a \leq 1$) having constant alloy compositions (1-a) and a of gallium arsenide GaAs and gallium phosphide GaP respectively is formed on a single-crystalline substrate of gallium phosphide GaP or gallium arsenide GaAs. The emitted light wavelength of the light emitting diode is determined by the alloy composition a, which is 0.9 for the yellow-color light emitting diode, 0.65 for the orange-color diode and 0.57 for the red-color diode.

A compound semiconductor epitaxial wafer 1 having such an epitaxial layer of the gallium arsenide phosphide $GaAs_{1-a}P_a$ as mentioned above is, as shown in FIG. 3, made up of a single-crystalline substrate 2 of, e.g., n type gallium phosphide GaP, an n type gallium phosphide GaP epitaxial layer 3, an alloy composition gradient layer 4 of n type gallium arsenide phosphide $GaAs_{1-x}P_x$ ($0 \leq x \leq 1$) having an alloy composition (1-x) of gallium arsenide GaAs varies in the growth direction of the epitaxial layer, an alloy composition constant layer 5 of gallium arsenide phosphide $GaAs_{1-a}P_a$ ($0 \leq a \leq 1$) having a constant alloy composition (1-a) of gallium arsenide GaAs, and an alloy composition constant layer 6 of n type gallium arsenide phosphide $GaAs_{1-a}P_a$ having a constant alloy composition (1-a) of gallium arsenide GaAs and is doped with nitrogens N as isoelectronic traps, which are sequentially formed on the single-crystalline substrate 2.

The term "compound semiconductor epitaxial wafer" as used in the present specification refers to a wafer having an epitaxial layer of compound semiconductor. Further, the term "compound semiconductor wafer" as used herein refers to a single-crystalline substrate of compound semiconductor or a compound semiconductor epitaxial wafer. Furthermore, these gallium arsenide phosphide $GaAs_{1-x}P_x$ alloy composition gradient layer 4, gallium arsenide phosphide $GaAs_{1-a}P_a$ alloy composition constant layer 5, and gallium arsenide phosphide $GaAs_{1-a}P_a$ alloy composition constant layer 6 doped with nitrogen N will sometimes be generally referred to as the gallium arsenide phosphide GaAsP layers.

In order to grow any of the epitaxial layers 3, 4, 5 and 6 on the compound semiconductor wafer to fabricate the aforementioned compound semiconductor epitaxial wafer 1, there has conventionally been used such a vapor phase growth apparatus 20 as shown, e.g., in FIG. 4.

In the vapor phase growth apparatus 20, compound semiconductor wafers 21a, 21b and 21c are placed on a wafer holder 27 disposed inside a reaction furnace 29 so that the reaction furnace 29 is heated by a heater (not shown) located outside the reaction furnace 29 while a hydrogen $H_2$ gas as a carrier gas 22 is introduced into the reaction furnace 29.

Collectively supplied together with the carrier gas 22 from a gas inlet 24 at one end of the reaction furnace 29 to a gas outlet 26 at the other end thereof are a group III source gas 23 containing gallium chloride GaCl, and a group V source gas 25 containing phosphine $PH_3$ and/or arsine $AsH_3$. The group III source gas 23 and group V source gas 25 react with each other on the compound semiconductor wafers 21a, 21b and 21c to grow epitaxial layers.

The above vapor phase epitaxial growth method, however, has a defect that, since the group III source gas 23 and group V source gas 25 are collectively supplied from one end of the reaction furnace 29, the epitaxial layer formed as grown on the wafer placed closer to the upstream side is thicker and the epitaxial layer on the wafer placed closer to the downstream side is thinner, because the downstream side has less source gases. This is because most of the group III source gas 23 and group V source gas 25 react on the side closer to the gas inlet 24 with the result that a relatively large amount of reaction product deposits on the upstream-side wafer; whereas, the residual source gases react on the side closer to the gas outlet 26 with the result that a relatively small amount of reaction product deposits on the downstream-side wafer. The thickness of the epitaxial layer greatly varies between the upstream and downstream wafers, and the maximum of the variation sometimes reaches 3 or 4 times the minimum of the variation in the reaction furnace.

Since the thickness of the epitaxial layer is associated with characteristics of emitted light wavelength, luminance, forward voltage, etc., variations in the thickness of the epitaxial layer will cause variations in the above quality characteristics.

SUMMARY OF THE INVENTION

It is therefore an object of the present invention to provide a method for fabricating a compound semiconductor epitaxial wafer which can overcome the above problems in the related art and can eliminate variations in the thickness of an epitaxial layer grown in a reaction furnace to obtain a uniform film thickness distribution, and also to provide a vapor phase growth apparatus for implementing the method.

In accordance with an aspect of the present invention, the above object is attained by providing a method for fabricating a compound semiconductor epitaxial wafer wherein a periodic table group III source gas and a periodic table group V source gas are supplied into a reaction furnace of a vapor phase growth apparatus to epitaxially grow a compound semiconductor film on main surfaces of a plurality of compound semiconductor wafers arranged within the reaction furnace. In the method, the group III source gas is flowed from one end of the reaction furnace to the other end thereof in such a manner that a flow path of the group III source gas is established along an array direction of the plurality of compound semiconductor wafers. And the group V source gas is supplied as dispersedly from a plurality of locations at halfway of the flow path of the group III source gas.

In the method, the gas supply step is carried out by directing the group V source gas toward the compound semiconductor wafers from their vicinities.

In particular, when the plurality of compound semiconductor wafers are arranged so that the main surfaces of the wafers are parallel to the flow path of the group III source gas, it is preferable that the group V source gas be supplied from positions opposed to the compound semiconductor wafers.

In this case, the supply positions of the group V source gas are set, from the viewpoint of causing a sufficient amount of group V source gas to reach the wafer surfaces, so that a vertical distance between the supply positions and the main surfaces of the compound semiconductor wafers is preferably not smaller than 1 mm and not larger than 20 mm. In this connection, when the vertical distance is too small, the gas discharge ports become too close to the compound semiconductor film or brought into contact therewith as the epitaxial growth of the compound semiconductor film advances, making it difficult to smoothly feed the group V source gas. When the vertical distance is too large, on the other hand, the group V source gas is flowed away by the group III source gas, with the result that a film thickness distribution becomes gradually worse and the compound semiconductor film disadvantageously deposits on the gas discharge ports. The vertical distance is preferably in a range of not smaller than 3 mm and not larger than 10 mm.

In this connection, it is preferable that the amount of the group III source gas to be supplied be made excessive with respect to the amount of the group V source gas to be supplied. This is because, in the above case, the formation reaction of the compound semiconductor film will be supply-controlled with regard to the group V source gas, so that, so long as only the group V source gas is uniformly supplied from a plurality of locations, a uniform amount of compound semiconductor is formed at any position and thus a uniform thickness of compound semiconductor film can be formed on the wafers.

A vapor phase growth apparatus for fabricating such a compound semiconductor epitaxial wafer comprises a reaction furnace, a wafer holder for holding the plurality of compound semiconductor wafers along a longitudinal direction of the reaction furnace therewithin, a first gas supply member for supplying the group III source gas from one end of the reaction furnace to the other end thereof in the furnace longitudinal direction, and a second gas supply member for dispersedly supplying the group V source gas from a plurality of gas discharge ports made open along a flow path of the group III source gas.

It is preferable that the gas discharge ports of the second gas supply member be made open as directed toward the compound semiconductor wafers in the vicinities thereof. In particular, when the wafer holder holds the compound semiconductor wafers in such a manner that main surfaces of the compound semiconductor wafers are directed parallel to a longitudinal direction of the reaction furnace, the gas discharge ports are made open preferably as opposed to the main surfaces.

In this case, it is preferable that opening faces of the gas discharge ports of the group V source gas be positioned so that a vertical distance between the main surfaces of the compound semiconductor wafers and the gas discharge ports is not smaller than 1 mm and not larger than 20 mm.

The second gas supply member are made so that a total opening area of the gas discharge ports per one of the compound semiconductor wafers is preferably increased as it goes toward a downstream side of the flow path of the group III source gas. This is because the group V source gas per se flowing through the second gas supply member becomes hard to flow as it goes toward the end due to its fluid resistance, which is corrected by increasing the total opening area of the gas discharge ports so that a uniform amount of group V source gas can be supplied at any supply location.

Assume now that the number of such gas discharge ports is only one for each supply location, the opening diameter of the ports in the downstream side should be made larger. When such an arrangement is employed that the opening diameter is relatively small and the number of gas discharge ports having an identical opening diameter is varied depending on each location, its design can be facilitated and fine adjustment of the amount of gas to be supplied can be realized.

DESCRIPTION OF THE PREFERRED EMBODIMENTS

An embodiment of the present invention will be detailed with reference to the attached drawings.

Figure 1:
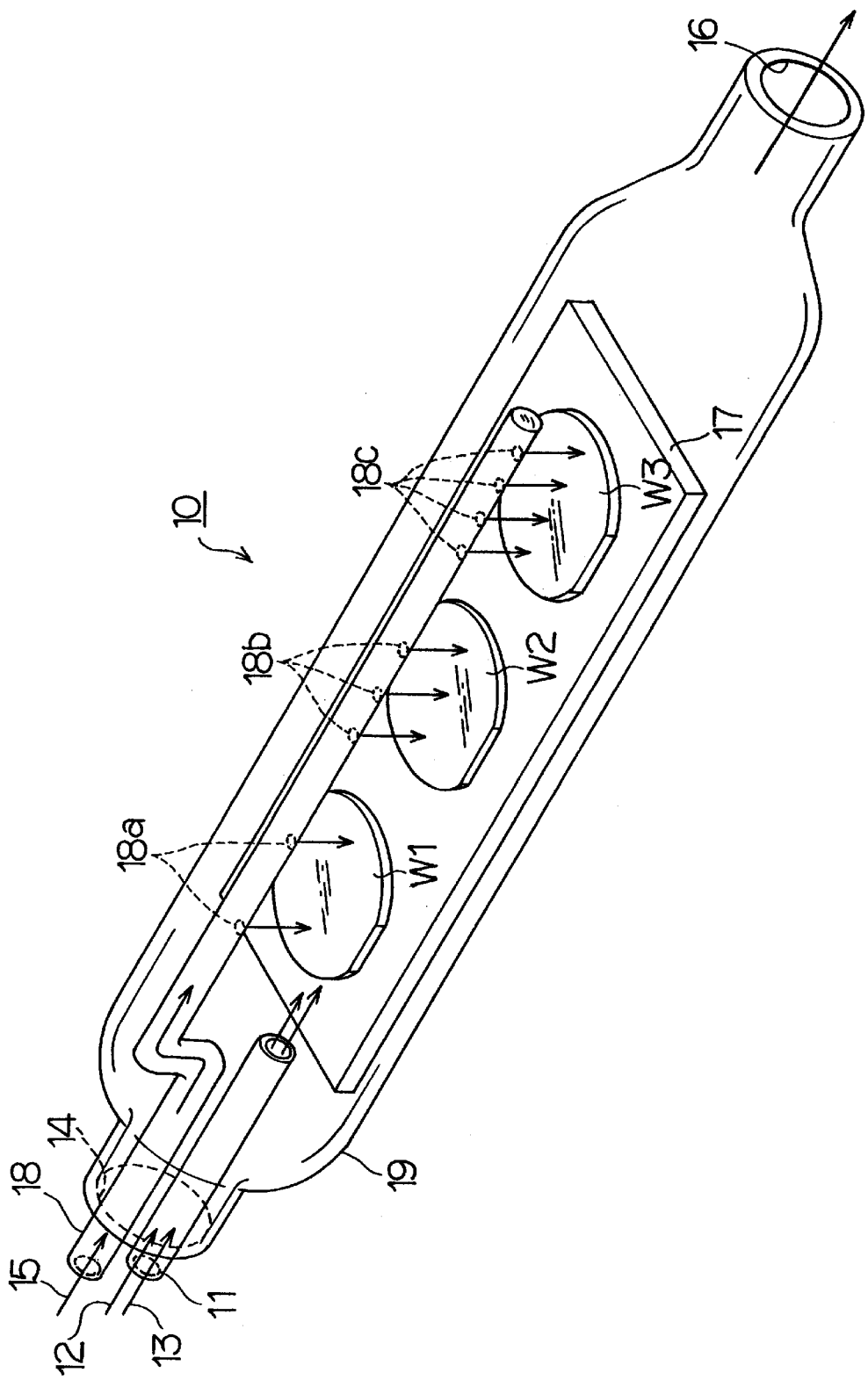
FIG. 1 schematically shows an exemplary arrangement of a vapor phase growth apparatus for fabricating a compound semiconductor epitaxial wafer in accordance with the present invention.
Figure 2:
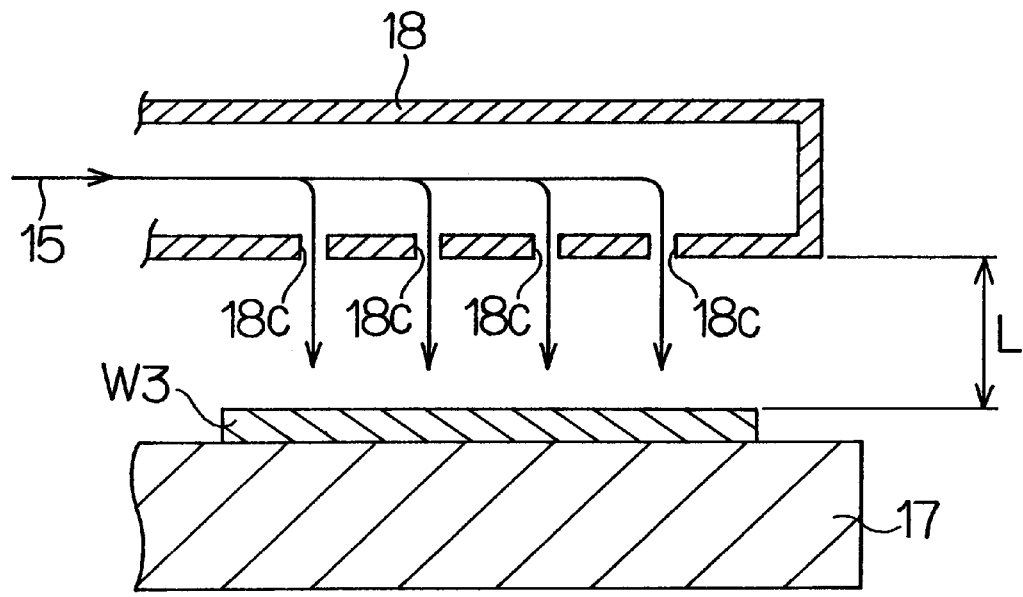
FIG. 2 is an enlarged cross-sectional view of a gas outlet in FIG. 1.

FIG. 1 schematically shows a structure of a vapor phase growth apparatus 10 in accordance with an embodiment of the present invention, and FIG. 2 is an enlarged cross-sectional view of a gas outlet in FIG. 1.

The vapor phase growth apparatus 10 of the present invention incorporate a reaction furnace 19 having a gas inlet 14 and a gas outlet 16. Supplied from the gas inlet 14 through a first gas supply tube 11 toward the gas outlet 16 at the other end of the tube are a hydrogen $H_2$ as a carrier gas 12 and a group III source gas 13 containing gallium chloride GaCl. That is, a flow path of the group III source gas 13 is established from the gas inlet 14 to the gas outlet 16.

Provided within the reaction furnace 19 is a wafer holder 17, on which compound semiconductor wafers W1, W2 and W3 are placed. In the illustrated example, the compound semiconductor wafers W1, W2 and W3 are arranged in a row along the flow path of the group III source gas 13 so that major surfaces of the wafers are parallel to the flow path. Although three wafers have been arranged in a row in FIG. 1, the numbers of such wafers and row are not limited to the specific example.

The reaction furnace 19 also incorporates a second gas supply tube 18 which extends along the inner wall of the furnace from the gas inlet 14 to the gas outlet 16. Supplied into the second gas supply tube 18 is a group V source gas 15 which contains phosphine $PH_3$ and/or arsine $AsH_3$.

The second gas supply tube 18 is provided at its three side locations with gas discharge ports 18a, 18b and 18c which are opposed to the main surfaces of the compound semiconductor wafers W1, W2 and W3 respectively to discharge the group V source gas in a direction perpendicular to the main surfaces of the wafers.

In the illustrated example, the respective numbers of gas discharge ports 18a, 18b and 18c corresponding to the compound semiconductor wafers W1, W2 and W3 are set to be increased as it goes from the upstream side of the flow path of the group III source gas 13 to the downstream side thereof. In this case, the gas discharge ports are all circular and has a diameter of 0.3 to 4 mm. The number of gas discharge ports 18a corresponding to the compound semiconductor wafer W1 is set to be two, the number of gas discharge ports 18b corresponding to the compound semiconductor wafer W2 is set to be three, and the number of gas discharge ports 18c corresponding to the compound semiconductor wafer W3 is set to be four. In other words, a total opening area of the gas outlet ports for the compound semiconductor wafer W1 is set to be minimum, and a total opening area for the compound semiconductor wafer W3 is to be maximum.

In this way, the respective total opening areas for the gas discharge ports are changed depending on the associated wafers. This is because, due to the fluid resistance of the interior of the second gas supply tube 18, the group V source gas flows more easily on the upstream side of the interior of the second gas supply tube 18 and flows less easily on the downstream side, so that the number of discharge ports for the downstream wafer is made larger than that for the upstream wafer to thereby supply a uniform amount of group V source gas 15 to the wafers.

The linear velocity of the discharged group V source gas 15 is large on the upstream side and small on the downstream side. The term "linear velocity" as used herein is expressed by a division of the gas flow rate per unit time by its cross-sectional area and in units of, e.g., cm/min.

Although the flowability of the group V source gas 15 has been controlled by adjusting the numbers of such ports in the respective groups as an example in FIG. 1, the flowability adjustment may be effected by adjusting the size of each port or by selecting combinations of the port number and size. In either case, the total opening area of the gas discharge port group located on the uppermost-stream side of the flow path of the group III source gas 13 should be minimum, while the total opening area of the gas discharge port group located on the lowermost-stream side thereof should be maximum.

A vertical distance L between the gas discharge ports 18a, 18b, 18c and compound semiconductor wafers W1, W2, W3 is set to be 1 to 20 mm. When the vertical distance L is too small, the gas discharge ports 18a, 18b or 18c are undesirably contacted with the compound semiconductor wafers W1, W2 or W3. When the vertical distance L exceeds 20 mm, the group V source gas 15 is flowed away by the group III source gas 13, for which reason the film thickness distribution of the GaAsP compound semiconductor film becomes worse and the GaAsP compound semiconductor film tends to deposit on the gas discharge ports 18a, 18b and 18c.

The thickness of the epitaxial layer varies depending also on a temperature distribution in the interior of the reaction furnace 19. Thus, in order to obtain a uniform film thickness, it is preferable in a preliminary experiment to adjust the amount of group V source gas 15 to be fed by epitaxially growing a compound semiconductor film and by increasing the total opening area of any of the gas discharge port 18a, 18b or 18c associated with the relatively thin area of the film or by decreasing the total opening area of any of the gas discharge port 18a, 18b or 18c associated with the relatively thick area of the film.

In order to epitaxially grow a compound semiconductor film within the reaction furnace 19, first of all, the compound semiconductor wafers W1, W2 and W3 placed within the reaction furnace 19 are heated by a heater (not shown) located outside the reaction furnace 19 while the carrier gas 12 is introduced into the reaction furnace 19.

Then supplied from the gas inlet 14 toward the gas outlet 16 via the first gas supply tube 11 is, together with the carrier gas 12, the group III source gas 13 which contains gallium chloride GaCl. At the same time supplied from the gas discharge ports 18a, 18b and 18c of the second gas supply tube 18 is the group V source gas 15 as dispersively directed toward the associated opposing compound semiconductor wafers W1, W2 and W3.

When the group V source gas 15 is fed through the second gas supply tube 18 as dispersed into the vicinities of the compound semiconductor wafers W1, W2 and W3; the group V source gas will not react with the group III source gas before the group V source gas is discharged from the second gas supply tube 18, an identical concentration of the group V source gas can be fed into the vicinities of the compound semiconductor wafers W1, W2 and W3. In addition, without affected with the flow of the group III source gas 13, the group V source gas 15 can reliably reach the compound semiconductor wafers W1, W2 and W3 spaced by the vertical distance L from the respectively opposing gas discharge ports 18a, 18b and 18c and can be brought into efficient contact with the group III source gas 13, thereby advancing its vapor phase growth smoothly.

Meanwhile, in a reaction wherein a gallium arsenide phosphide GaAsP layer is epitaxially grown, it is well known that, when the group III source gas is excessively supplied as compared with the group V source gas, the reaction is controlled by the group V source gas containing phosphine $PH_3$ and arsine $AsH_3$.

Thus, when the gallium chloride GaCl as the group III source gas is excessively fed from the gas inlet 14 and when the group V source gas 15 containing the phosphine $PH_3$ and arsine $AsH_3$ is fed dispersively in the vicinities of the respective compound semiconductor wafers W1, W2 and W3 by an amount necessary for formation of a desired layer thickness, there can be formed an epitaxial layer which has a uniform thickness on each of the wafers.

Embodiments

EXAMPLE 1

Figure 3:
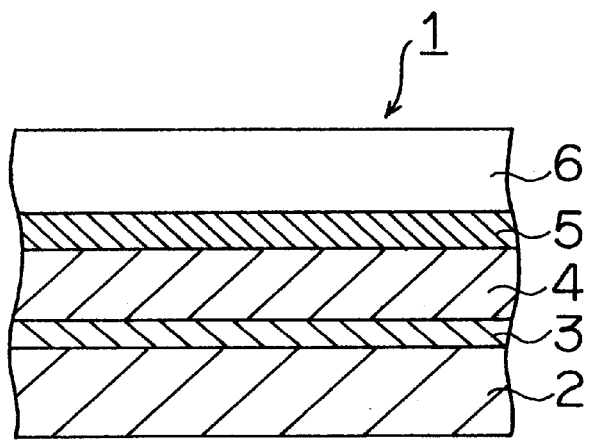
FIG. 3 shows, in a model form, a cross-sectional view of a structure of the compound semiconductor epitaxial wafer fabricated according to present invention.

Such a vapor phase growth apparatus 10 as shown in FIG. 1 was used to form such a compound semiconductor epitaxial wafer 1 shown in FIG. 3.

First, three slices of gallium phosphide GaP single-crystalline substrates as compound semiconductor wafers W1, W2 and W3 were placed on a wafer holder 17 accommodated within a reaction furnace 19 along a flow direction of a group III source gas 13. Each of the gallium phosphide GaP single-crystalline substrates is an n type substrate which is mirror-polished, has a thickness of about 300 $\mu$m, a diameter of 50 mm, a crystal orientation of (100) and an off angle of 10 degrees.

In this case, the gas discharge ports 18a, 18b and 18c were set to have each a diameter of 2 mm, and the vertical distance between the gas discharge ports and wafers W1, W2 and W3 was set at 7 mm.

A nitrogen $N_2$ gas was introduced into the reaction furnace 19 to sufficiently purge the air, after which a hydrogen $H_2$ as the carrier gas was introduced into the reaction furnace 19 at a flow rate of 3640 $cm^3$/minute to displace the atmosphere, and then a temperature within the furnace was started to increase.

After the temperature of the compound semiconductor wafers W1, W2 and W3 reached 845° C., a high-purity hydrogen chloride HCl was introduced into the furnace 19 at a flow rate of 140 cm$^3$/minute to react with high-purity gallium Ga (not shown) within the reaction furnace and to generate a gallium chloride GaCl 13 gas as a group III source gas 13. The generated gallium chloride GaCl 13, together with the carrier hydrogen H$_2$ gas 12, was fed from the gas inlet 14 into the furnace.

At the same time, phosphine PH$_3$ diluted into 10% with hydrogen H$_2$ as the group V source gas 15 as well as hydrogen sulfide H$_2$S 50 ppm-diluted with hydrogen H$_2$ were both fed into the second gas supply tube 18 at flow rates of 700 cm$^3$/minute and 190 cm$^3$/minute, respectively, and then discharged from the gas discharge ports 18a, 18b and 18c toward the respectively opposing compound semiconductor wafers W1, W2 and W3 in a direction perpendicular thereto. This resulted in that the phosphine PH$_3$ gas as the group V source gas 15 was brought into contact with the gallium chloride GaCl gas as the group III source gas 13 to thereby grow an n type gallium phosphide GaP epitaxial layer 3 having a thickness of about 3 μm on each gallium phosphide GaP single-crystalline substrate.

Epitaxial layers to be next grown are doped with sulfur S and are all of an n type.

Subsequently, the flow rate of the phosphine PH$_3$ diluted into 10% with hydrogen H$_2$ was gradually decreased from 700 cm$^3$/minute to 455 cm$^3$/minute and at the same time, the flow rate of arsine AsH$_3$ diluted into 10% with hydrogen H$_2$ was gradually increased from 0 cm$^3$/minute to 245 cm$^3$/minute. Further, the wafer temperature was decreased gradually from 845° C. to 810° C. In this way, by changing a ratio between the phosphine PH$_3$ and arsine AsH$_3$ in the group V source gas 15, there was formed an n type gallium arsenide phosphide GaAs$_{1-x}$P$_z$ alloy composition gradient layer 4 ($0 \leq x \leq 0.65$) whose alloy composition (1−x) of gallium arsenide GaAs varies in the growth direction of the epitaxial layer and which has a thickness of 12 μm on the n type gallium phosphide GaP epitaxial layer 3.

Thereafter, in the similar manner to the above, an n type gallium arsenide phosphide GaAs$_{1-a}$P$_a$ alloy composition constant layer 5 (GaAs$_{0.35}$P$_{0.65}$) of 5 μm thick having a constant alloy composition of gallium arsenide GaAs of (1−a)=0.35 was formed, on which further formed is an n type gallium arsenide phosphide GaAs$_{1-a}$P$_a$ alloy composition constant layer 6 (GaAs$_{0.35}$P$_{0.65}$) of 18 μm thick which has the same alloy composition as the layer 5 and which is doped with nitrogens N as isoelectronic traps.

A total thickness of the epitaxial layers 3, 4, 5 and 6 thus formed on the gallium phosphide GaP single-crystalline substrate was measured. As a result, its maximum thickness was 42.0 μm in the center of the epitaxial layer on the compound semiconductor wafer W1, and its minimum was 33.6 μm in the lowermost stream part of the epitaxial layer formed on the compound semiconductor wafer W3. That is, variations in the layer thickness in the same lot was as very small as 1.25 times when expressed in terms of a magnification of the maximum to the minimum.

By the way, a wavelength of emitted light of the compound semiconductor epitaxial wafer 1 is determined by the alloy composition a of the alloy composition constant layer 6 of the n type gallium arsenide phosphide GaAs$_{1-a}$P$_a$ doped with nitrogen N. Whether to obtain a design wavelength of emitted light is one of important characters as well as the layer thickness distribution and luminous intensity of the epitaxial layer.

To this end, the compound semiconductor epitaxial wafer 1 fabricated according to the present example was subjected to evaluation of its light emission characteristics by the photoluminescence method. First, an argon laser having a wavelength of 514.5 nm was irradiated on the main surface of the compound semiconductor epitaxial wafer 1. This causes the wafer 1 to absorb the irradiated laser beam and at the same time, to emit photoluminescent light having a wavelength corresponding to the alloy composition a of the alloy composition constant layer 6 of the gallium arsenide phosphide GaAs$_{1-a}$P$_a$ formed on the wafer main surface. Thus a wavelength λp where the intensity of the photoluminescent light becomes maximum was measured.

It was found from the measurement that among the three slices of wafers, a longest wavelength λp of 629 nm was observed for the compound semiconductor epitaxial wafer corresponded to compound semiconductor wafer W1, whereas, a shortest wavelength λp of 626 nm was observed for the one corresponded to compound semiconductor epitaxial wafer W3. That is, a variation in the emitted light wavelength of the three compound semiconductor epitaxial wafers obtained in the same lot was 3 nm when expressed in terms of a difference between the longest and shortest values.

COMPARATIVE EXAMPLE 1

Figure 4:
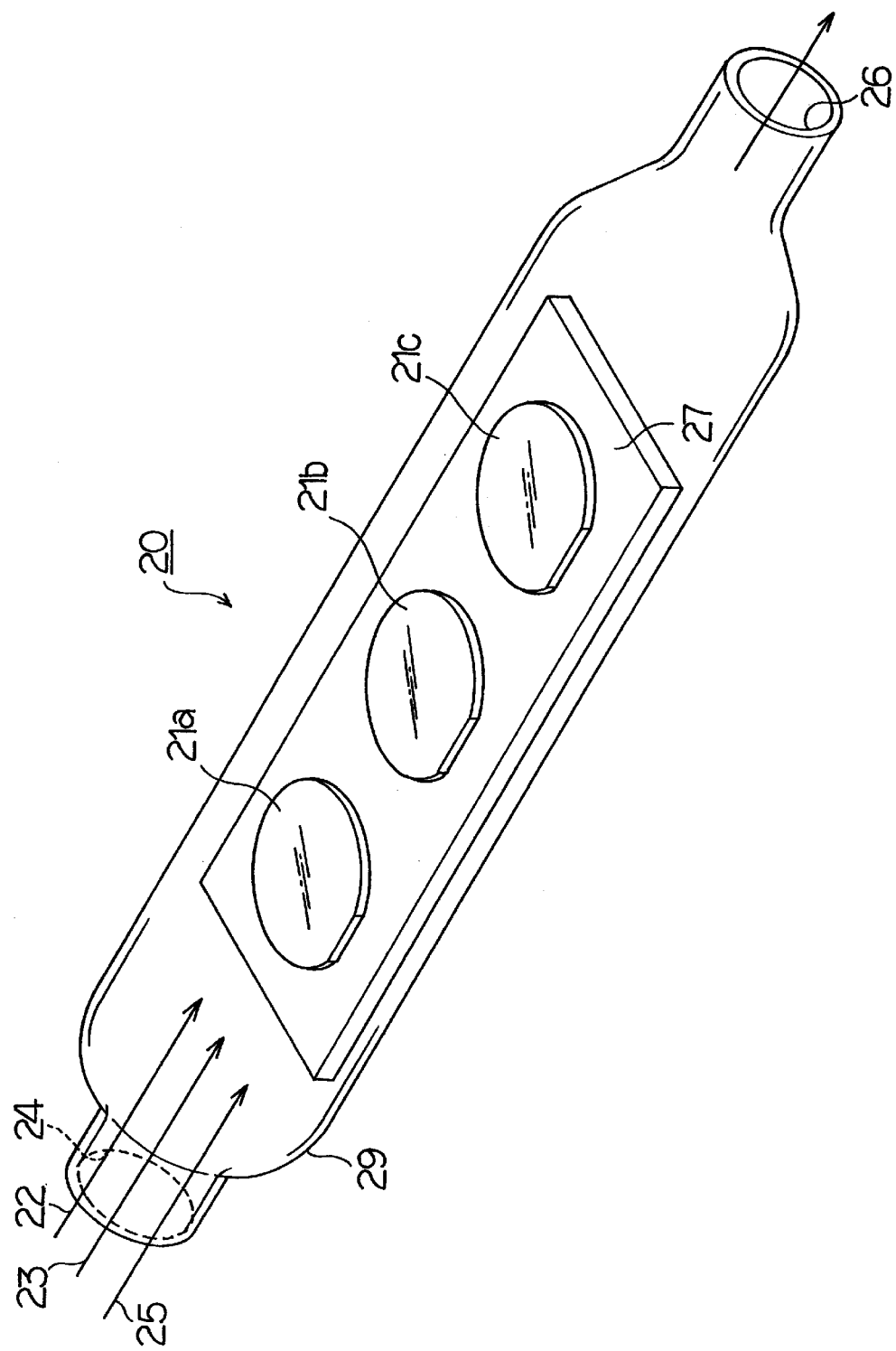
FIG. 4 schematically shows an exemplary arrangement of a prior art vapor phase growth apparatus for fabricating a compound semiconductor epitaxial wafer.

Such a compound semiconductor epitaxial wafer 1 as shown in FIG. 3 was formed substantially in the same manner as in Example 1, except that such a prior art vapor phase growth apparatus 20 as shown in FIG. 4 was used.

As a result of measuring a total thickness of the epitaxial layers 3, 4, 5 and 6 formed on gallium phosphide GaP single-crystalline substrates 21a, 21b and 21c, it was found that the total thickness was as maximum as 60 μm in the uppermost stream area on the GaP single-crystalline substrate 21a, and was as minimum as 18.2 μm in the lowermost stream area on the GaP single-crystalline substrate 21c. In other words, a variation in the total layer thickness in the same lot reached 3.3 times when expressed in terms of a magnification of the maximum to the minimum.

Further, when the wavelength λp of the emitted light was measured by the photoluminescence method, a longest value of 631 nm and a shortest value of 623 nm were observed for the compound semiconductor epitaxial wafers formed on the gallium phosphide GaP single-crystalline substrates 21a and 21c, respectively. That is, a variation in the wavelength was as large as 8 nm.

Although the present invention has been explained in connection with the specific example, the present invention is not limited to the specific example. For example, the present invention can be similarly applied not only to such a horizontal vapor phase growth apparatus as shown in FIG. 1 but also to a vertical barrel type apparatus. Further, the thicknesses, alloy compositions and epitaxial growth conditions of the respective epitaxial layers may be suitably modified, selected and combined as necessary.

As has been explained in the foregoing, in accordance with the method for fabricating a compound semiconductor epitaxial wafer and with the vapor phase epitaxial growth for implementing the method, since the group V source gas as the layer thickness control gas is supplied to the respective compound semiconductor wafers through the second gas supply tube separately from the group III source gas and then brought into contact with the group III source gas in the very vicinities of the compound semiconductor wafers; the thickness of the epitaxial films can be effectively controlled.

Thereby there can be obtained a uniform thickness of epitaxial layers independently of the arrangement of the wafers within the reaction furnace. The epitaxial wafers thus obtained can provide a uniform wavelength distribution when used for fabrication of, e.g., light emitting diodes, thus finding industrially highly useful applications.

What is claimed is:

1. A method for fabricating a compound semiconductor epitaxial wafer wherein a periodic table group III source gas and a periodic table group V source gas are supplied into a reaction furnace of a vapor phase growth apparatus to epitaxially grow a compound semiconductor film on main surfaces of a plurality of compound semiconductor wafers arranged within said reaction furnace, said method comprising the steps of:

flowing said group III source gas from one end of said reaction furnace to the other end thereof in such a manner that a flow path of the group III source gas is established along an array direction of said plurality of compound semiconductor wafers;

supplying as dispersedly said group V source gas from a plurality of locations at halfway of the flow path of said group III source gas: and wherein the supply positions of said group V source gas are set so that a vertical distance between said supply positions and the main surfaces of said compound semiconductor wafers is not smaller than 1 mm and not larger than 20 mm.

2. A method for fabricating a compound semiconductor epitaxial wafer wherein a periodic table group III source gas and a periodic table group V source gas are supplied into a reaction furnace of a vapor phase growth apparatus to epitaxially grow a compound semiconductor film on main surfaces of a plurality of compound semiconductor wafers arranged within said reaction furnace, said method comprising the steps of:

flowing said group III source gas from one end of said reaction furnace to the other end thereof in such a manner that a flow path of the group III source gas is established along an array direction of said plurality of compound semiconductor wafers;

supplying as dispersedly said group V source gas from a plurality of locations at halfway of the flow path of said group III source gas;

wherein said gas supply step is carried out by directing said group V source gas toward said compound semiconductor wafers from their close vicinities;

wherein said plurality of compound semiconductor wafers are arranged so that the main surfaces of said wafers are parallel to the flow path of said group III source gas, and said group V source gas is supplied from positions opposed to the compound semiconductor wafers; and wherein the supply positions of said group V source gas are set so that a vertical distance between said supply positions and the main surfaces of said compound semiconductor wafers is not smaller than 1 mm and not larger than 20 mm.

3. A method for fabricating a compound semiconductor epitaxial wafer wherein a periodic table group III source gas and a periodic table group V source gas are supplied into a reaction furnace of a vapor phase growth apparatus to epitaxially grow a compound semiconductor film on main surfaces of a plurality of compound semiconductor wafers arranged within said reaction furnace, said method comprising the steps of:

flowing said group III source gas from one end of said reaction furnace to the other end thereof in such a manner that a flow path of the group III source gas is established along an array direction of said plurality of compound semiconductor wafers;

supplying as dispersedly said group V source gas from a plurality of locations at halfway of the flow path of said group III source gas;

wherein said gas supply step is carried out by directing said group V source gas toward said compound semiconductor wafers from their close vicinities;

wherein said plurality of compound semiconductor wafers are arranged so that the main surfaces of said wafers are parallel to the flow path of said group III source gas, and said group V source gas is supplied from positions opposed to the compound semiconductor wafers;

wherein the supply positions of said group V source gas are set so that a vertical distance between said supply positions and the main surfaces of said compound semiconductor wafers is not smaller than 1 mm and not larger than 20 mm; and wherein the amount of said group III source gas to be supplied is made excessive with respect to the amount of said group V source gas to be supplied.

4. A method for fabricating a compound semiconductor epitaxial wafer wherein a periodic table group III source gas and a periodic table group V source gas are supplied into a reaction furnace of a vapor phase growth apparatus to epitaxially grow a compound semiconductor film on main surfaces of a plurality of compound semiconductor wafers arranged within said reaction furnace, said method comprising the steps of:

flowing said group III source gas from one end of said reaction furnace to the other end thereof in such a manner that a flow path of the group III source gas is established along an array direction of said plurality of compound semiconductor wafers;

supplying as dispersedly said group V source gas from a plurality of locations at halfway of the flow path of said group III source gas;

wherein said gas supply step is carried out by directing said group V source gas toward said compound semiconductor wafers from their close vicinities; and wherein the supply positions of said group V source gas are set so that a vertical distance between said supply positions and the main surfaces of said compound semiconductor wafers is not smaller than 1 mm and not larger than 20 mm.

5. A method for fabricating a compound semiconductor epitaxial wafer wherein a periodic table group III source gas and a periodic table group V source gas are supplied into a reaction furnace of a vapor phase growth apparatus to epitaxially grow a compound semiconductor film on main surfaces of a plurality of compound semiconductor wafers arranged within said reaction furnace, said method comprising the steps of:

flowing said group III source gas from one end of said reaction furnace to the other end thereof in such a manner that a flow path of the group III source gas is established along an array direction of said plurality of compound semiconductor wafers;

supplying as dispersedly said group V source gas from a plurality of locations at halfway of the flow path of said group III source gas;

wherein said gas supply step is carried out by directing said group V source gas toward said compound semiconductor wafers from their close vicinities;

wherein the supply positions of said group V source gas are set so that a vertical distance between said supply positions and the main surfaces of said compound semiconductor wafers is not smaller than 1 mm and not larger than 20 mm; and wherein the amount of said group III source gas to be supplied is made excessive with respect to the amount of said group V source gas to be supplied.

* * * * *